(12) United States Patent
Doversberger

(10) Patent No.: US 7,784,340 B2
(45) Date of Patent: Aug. 31, 2010

(54) FORCE GRADIENT USING A NON-CONTACT PROXIMITY SENSOR

(75) Inventor: Terry G. Doversberger, North Richland Hills, TX (US)

(73) Assignee: Bell Helicopter Textron, Inc., Hurst, TX (US)

( * ) Notice: Subject to any disclaimer, the term of this patent is extended or adjusted under 35 U.S.C. 154(b) by 87 days.

(21) Appl. No.: 12/185,654

(22) Filed: Aug. 4, 2008

(65) Prior Publication Data

US 2010/0025524 A1   Feb. 4, 2010

(51) Int. Cl.
  *G01P 13/00* (2006.01)
(52) U.S. Cl. .................................. 73/170.02
(58) Field of Classification Search ............. None
  See application file for complete search history.

(56) References Cited

U.S. PATENT DOCUMENTS

| | | | |
|---|---|---|---|
| 3,175,786 A | 3/1965 | Frank et al. | |
| 3,504,279 A | 3/1970 | Foster et al. | |
| 3,733,039 A | 5/1973 | O'Connor et al. | |
| 4,500,967 A * | 2/1985 | Murphy et al. | ................ 701/12 |
| 4,563,743 A | 1/1986 | Murphy et al. | |
| 7,098,811 B2 | 8/2006 | Augustin et al. | |
| 7,273,231 B2 | 9/2007 | Stanley et al. | |
| 2008/0065278 A1 | 3/2008 | Shultz et al. | |

FOREIGN PATENT DOCUMENTS

JP           11108605 A  *  4/1999
WO  PCT/US2008/072147   10/2008

* cited by examiner

*Primary Examiner*—Lisa M Caputo
*Assistant Examiner*—Jermaine Jenkins
(74) *Attorney, Agent, or Firm*—Orrick, Herrington & Sutcliffe LLP

(57) ABSTRACT

An improved design for a force gradient using a proximity sensor is disclosed. A force gradient comprises a shaft having a first end and a second end. The switch includes a spring contained between the first end and the second end and a non-contact proximity sensor mounted on the second end. The spring has a first position and is compressed to a second position so that the non-contact proximity sensor signals an AFCS to change state.

14 Claims, 7 Drawing Sheets

FORCE GRADIENT USING A NON-CONTACT PROXIMITY SENSOR

FIELD

The present disclosure relates to aircraft control systems and, more particularly, an improved design for a force gradient using a non-contact proximity sensor.

BACKGROUND

In the field of aeronautics, a cyclic stick refers to a control device for the pilot to enable turns and forward power of an aircraft, particularly a helicopter. The cyclic stick typically uses a force gradient mechanism so that the amount of force applied to the cyclic stick translates into the desired control feel. A typical force gradient incorporates a spring that compresses as the pilot applies force to the cyclic stick. As the pilot increases the force applied to the cyclic stick, the spring compresses more and the control input becomes greater in magnitude.

Modern helicopters are equipped with an automatic flight control system (AFCS) and can be flown by either the manual input of the pilot or the AFCS. Typically, there is no automatic control to turn on and off the AFCS, and the input from the cyclic stick signals the pilot's intention to take over the control. In order to correctly interpret the pilot's intention, there must be a mechanism to determine whether or not the input received from the cyclic is indeed caused by the pilot or by an unintended change in flight conditions such as a wind gust, shift of center of gravity (CG), etc.

Traditional force gradient switches utilize a mechanical actuator mechanism to control the operation of an AFCS. The mechanical actuator mechanism requires frequent adjustment to maintain proper operating conditions. Oftentimes, the adjustment or maintenance requires disassembling the force gradient to gain access and service the inner parts. Due to such issues and inconveniences associated with the mechanical switch design, there is a need for a more convenient yet reliable solution that provides benefits over the conventional force gradient design.

SUMMARY

An improved design for a force gradient using a proximity sensor is disclosed. A force gradient comprises a shaft having a first end and a second end. The force gradient includes a spring contained between the first end and the second end and a non-contact proximity sensor mounted on the second end. The spring has a first position and is compressed to a second position so that the non-contact proximity sensor signals an AFCS to change state.

In accordance with the purpose of the various embodiments described herein, as broadly described herein, the subject matter of this patent relates to a force gradient used for a control input to an aircraft or a helicopter.

The above and other preferred features, including various novel details of implementation and combination of elements will now be more particularly described with reference to the accompanying drawings and pointed out in the claims. It will be understood that the particular methods and apparatus are shown by way of illustration only and not as limitations. As will be understood by those skilled in the art, the principles and features explained herein may be employed in various and numerous embodiments.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

Figure 1:
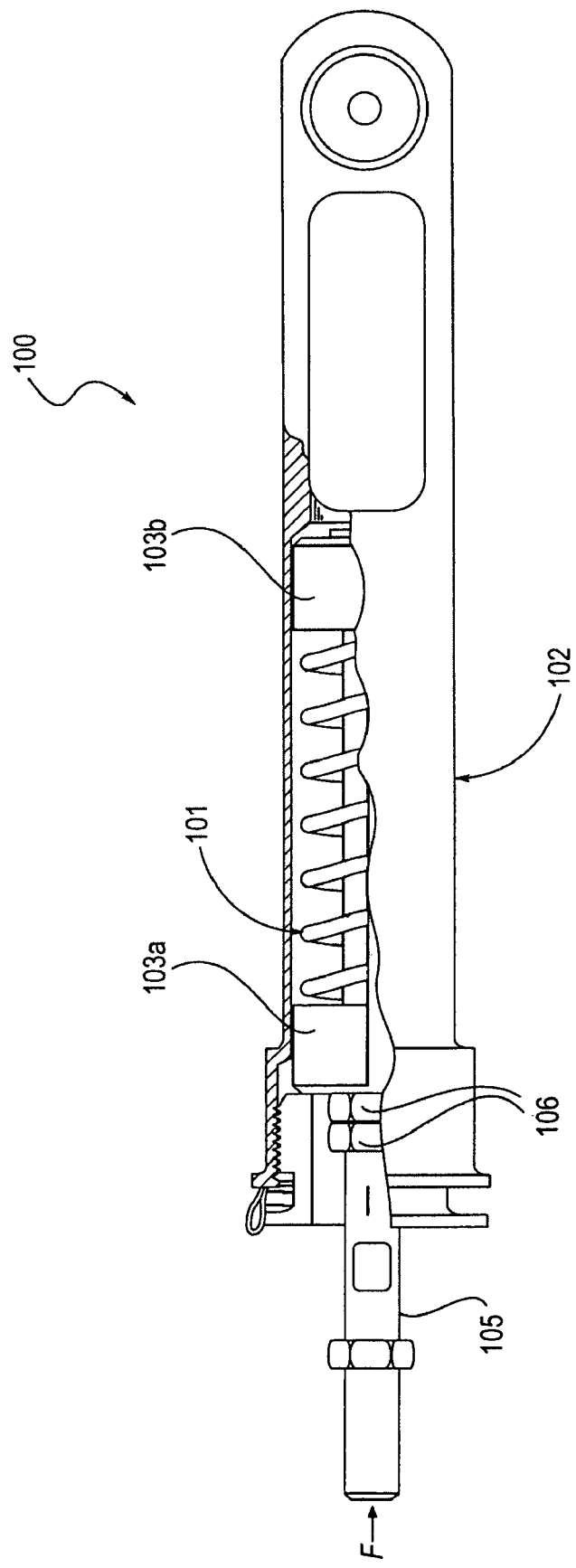
FIG. 1 shows a prior art force gradient without an AFCS switch.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings described herein and do not limit the scope of the claims.

DETAILED DESCRIPTION

An improved design for a force gradient using a proximity sensor is disclosed. A force gradient comprises a shaft having a first end and a second end. The switch includes a spring contained between the first end and the second end and a non-contact proximity sensor mounted on the second end. The spring has a first position and is compressed to a second position so that the non-contact proximity sensor signals an AFCS to change state.

Each of the additional features and teachings disclosed herein can be utilized separately or in conjunction with other features and teachings to provide an improved design for a force gradient using a proximity sensor. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 shows a prior art force gradient without an AFCS switch. The force gradient 100 provides a centering force for the cyclic and/or directional controls such as pitch, roll and yaw of an helicopter. The force gradient 100 is coupled to one end of the cyclic and concealed under the floor of the helicopter's cockpit. Spring 101 is contained within cylinder 102 by end caps 103 on both ends. An appropriate spring 101 is selected to provide proper stiffness, weight and length in accordance with the design specification. The spring rate determines the level of stiffness of the cyclic, thus it varies with the size and design of the cyclic.

A break-out force is required to start compressing spring 101. The break-out force is adjusted by making end cap 103a contact spring 101 in its natural length, thus preventing free-play or a dead-zone wherein no spring compression occurs with an increase in input force. Adjustment nuts 106 might be further tightened to create a non-zero break-out force. The applied force F must be greater than the compressed spring force to push spring assembly shaft 105 inward. The break-out force value, although related, is a separate requirement from the spring's specification.

Figure 2A:
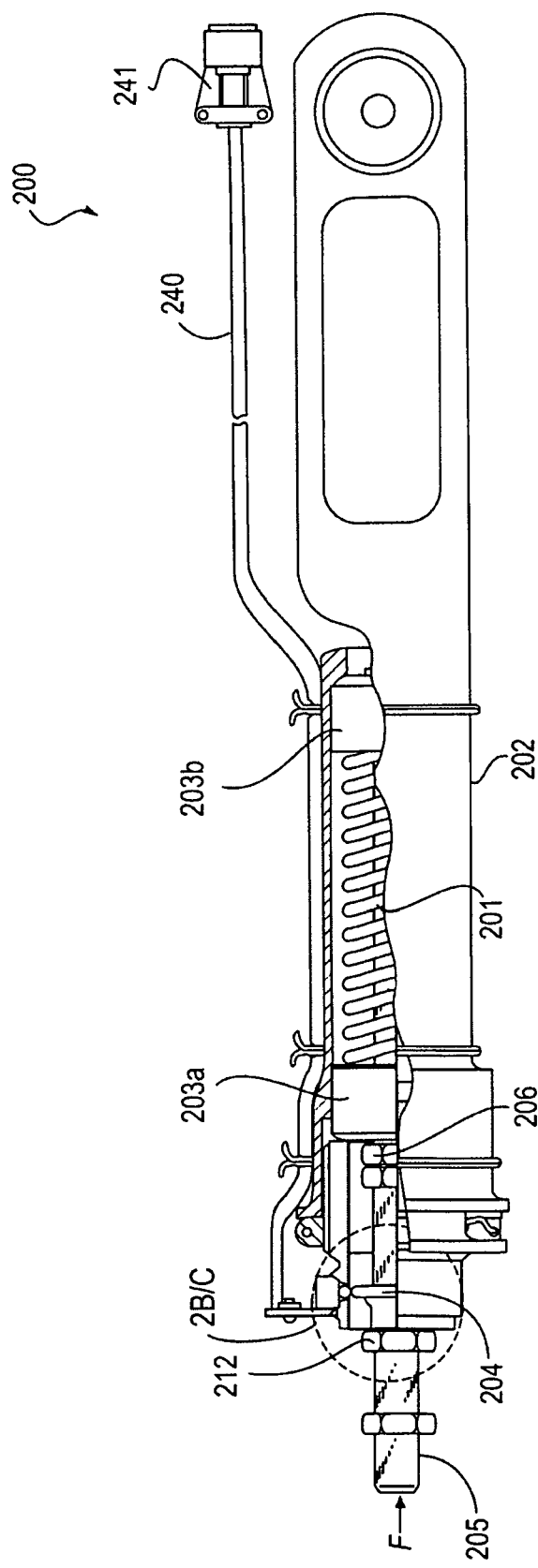
FIGS. 2A-2C show a prior art force gradient incorporating a mechanical switch to control the input to the AFCS.
Figure 2C:
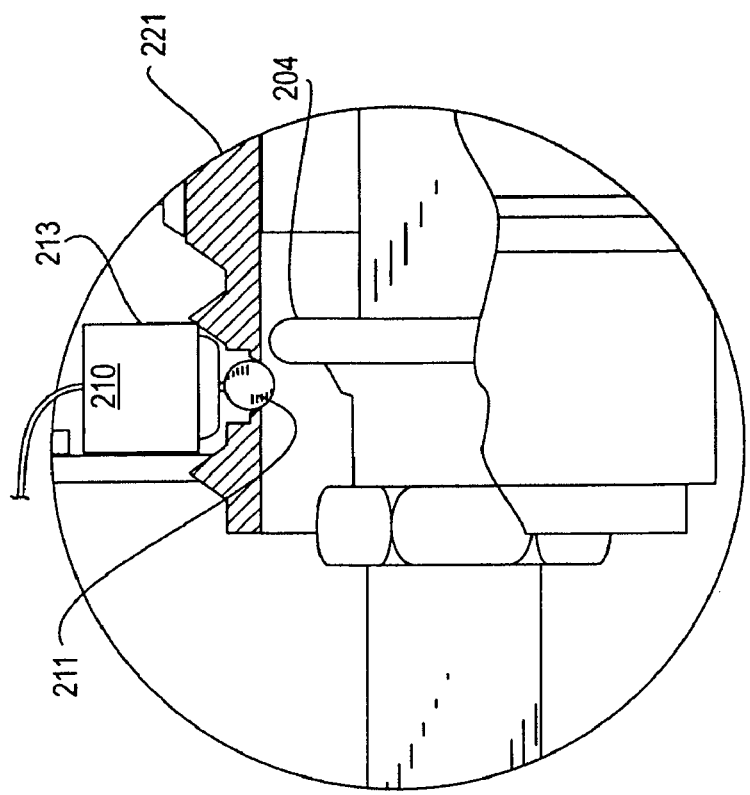
Figure 2B:
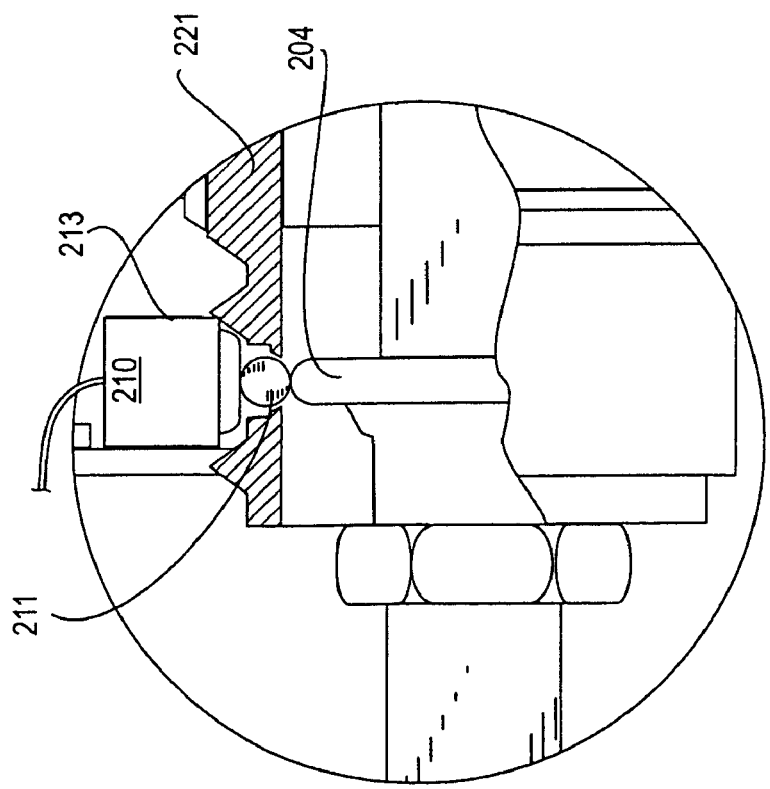

FIGS. 2A-2C show a prior art force gradient incorporating a mechanical switch to control the input to the AFCS. Actuator 204 is threaded onto spring assembly shaft 205 and locked in place with actuator jam nut 212. A steel ball 211 is placed inside retainer 213 and preloaded with switch 210. As actuator 204 passes by the neutral position, steel ball 211 rolls against it, and resultantly pushes micro switch 210. The electrical signal generated from micro switch 210 is plugged to the AFCS (not shown) through wire 240 and connector 241.

FIG. 2B shows a prior art configuration of a neutral position where there is no pilot input (or the applied force is smaller than the break-out force). Actuator 204 pushes up ball 211 to actuate micro switch 210 and signals the AFCS to take over control of the helicopter. FIG. 2C illustrates that when an input force is applied that is greater than the break-out force, spring 201 is compressed, and actuator 204 moves such that ball 211 moves lower within retainer 213 of ball guide 221. As a result, micro switch 210 opens and a control signal is generated to inform the AFCS to release control of the helicopter to the pilot. Similar to the force gradient 100, force gradient 200 requires end cap 203a to be properly adjusted so that actuator 204 positions at the neutral position without free-play and creates an appropriate break-out force.

Actuator adjustment is a sensitive process and sometimes requires multiple trials to achieve proper seating of actuator 204. An adjustable-length rod end bearing or clevis is threaded onto spring assembly shaft 205. Jam nut 212 is conveniently located outside of actuator 204 for the adjustment for break-out force or free-play. In some cases, the rod end bearing or clevis is positioned too far down the spring assembly shaft 205 so that actuator jam nut 212 is placed on the inside of actuator 204 as opposed to the outside of actuator 204. In this case, force gradient 200 needs to be disassembled to gain access and appropriately torque actuator jam nut 212. While making this adjustment, ball 211 is prevented from falling or jamming due to the tight tolerances required for machining ball 211 and ball guide 221. Another problem associated with the design of force gradient 200 is that the repeated movement of actuator 204 creates a groove in the path and causes sticky operation, which is undesirable for accurate control of micro switch 210.

Figure 3:
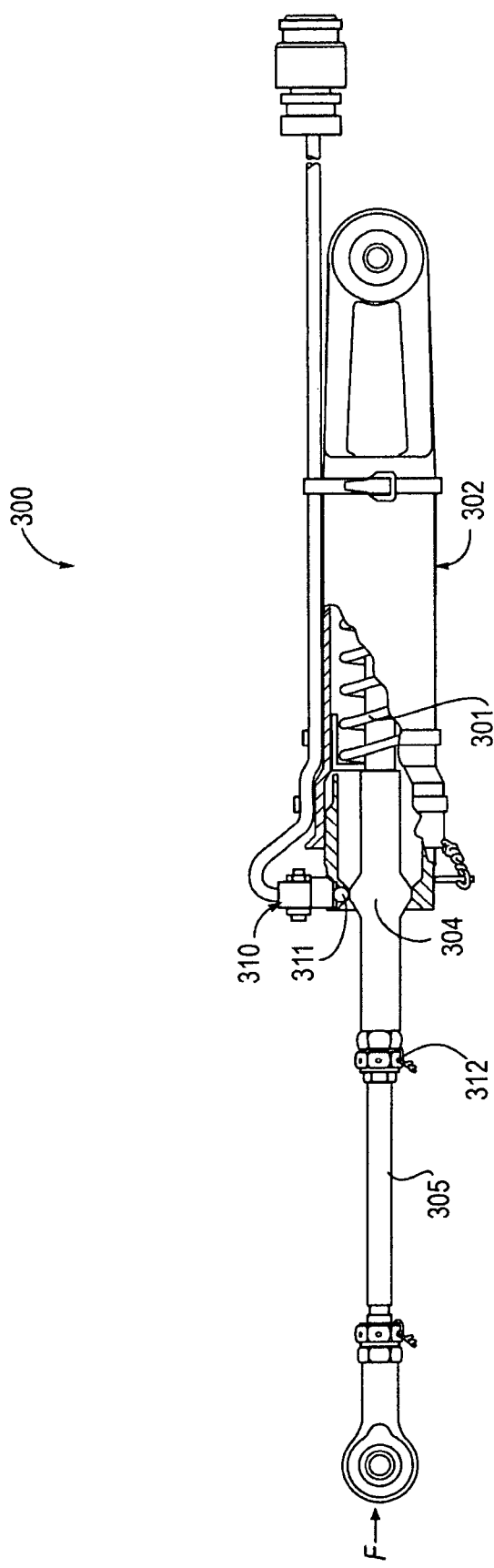
FIG. 3 shows another prior art force gradient incorporating an improved mechanical switch to control the input to the AFCS.

FIG. 3 shows another prior art force gradient incorporating an improved mechanical switch to control the input to the AFCS. Force gradient 300 is an improved design over force gradient 200 such that it reduces wear by actuator 304 by minimizing the contact angle between ball 311 and actuator 304. It also relocates actuator jam nut 312 farther outside cylinder 302 so that adjustment can be made with ease. Despite these improvements, force gradient 300 causes disadvantages in other respects; it requires a unique actuator for each application and the range of adjustment on the break-out force is greatly narrowed. In addition, force gradient switch 310 needs to be adjusted up or down to achieve a correct operating range of motion. These adjustments significantly vary due to the radial play of shaft 305 with respect to cylinder 302. While making these adjustments, over-torquing is likely to damage the components and ultimately affect the operation and reliability of force gradient 300.

There are two major problems associated with prior art force gradient 200 or 300: the requirement for frequent adjustment and the reliability issue over time due to mechanical wear and tear. According to one embodiment, the present switch resolves these problems by replacing the mechanical switch in a force gradient with a non-contact proximity sensor.

Figure 4A:
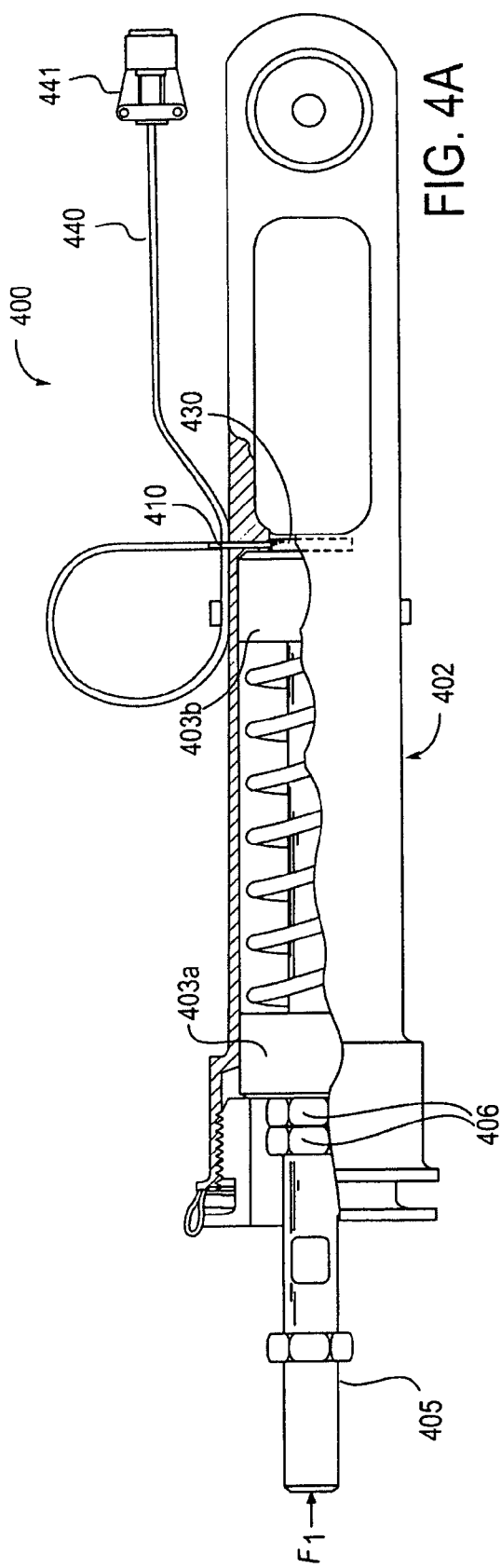
FIGS. 4A and 4B show an exemplary force gradient using a non-contact proximity sensor, according to one embodiment.
Figure 4B:
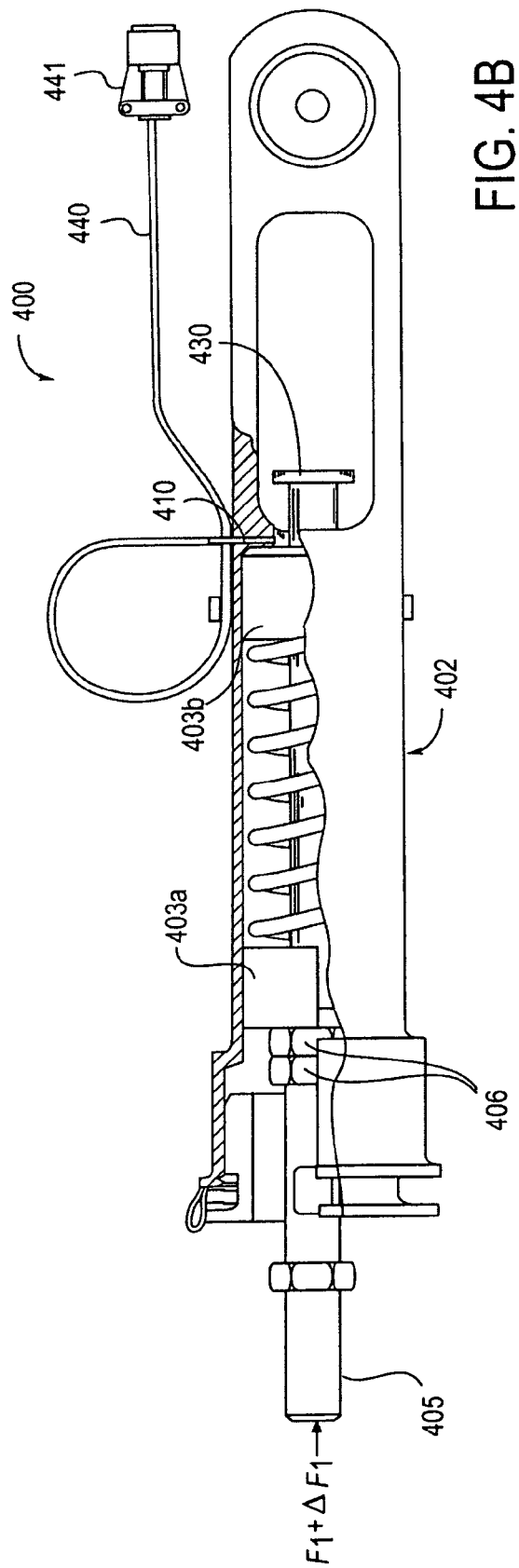

FIGS. 4A and 4B show an exemplary force gradient 400 using a non-contact proximity sensor 410, according to one embodiment. Sensor 410 may be an inductive sensor, a capacitive sensor, a magnetic sensor, a Hall-effect sensor or similar sensor that detects the presence or absence of an object within a close proximity. The electrical output from sensor 410 is routed and plugged to the AFCS (not shown) through wire 440 using connector 441. Connector 441 may be similar to connectors 241 or 341 used for a micro switch in FIGS. 2 and 3.

It is understood that other suitable non-contact sensors can be used without deviating from the scope of the present embodiments. Mechanical contact between an actuator and ball is eliminated using the present proximity sensor 410. The adjustment required to properly align an actuator with respect to a ball (thus to a micro switch) is also eliminated.

The free end of spring assembly shaft 405 contains a large diameter end plate 430. End plate 430 may be machined as a part of shaft 405 or assembled onto shaft 405 as a separate part. End plate 430 is allowed to pass by sensor 410 to activate the switch. With no pilot input, end plate 430 stays in close proximity to sensor 410 and signals the AFCS to operate (FIG. 4A). A minimum force F is required to deactivate the AFCS. When the pilot applies a force F+ΔF that is greater than the break-out force F, shaft 405 is pushed inward, spring 401 is compressed, end plate 430 moves out of the detection range of sensor 410, thus signaling the AFCS to deactivate (FIG. 4B). When the pilot removes the force by releasing the cyclic, end plate 430 returns to the detection range of sensor 410 by the spring force, and thereby signals the AFCS to retake control of the aircraft (FIG. 4A).

The break-out force F is appropriately set to effectively filter and eliminate unwanted or accidental inputs by the pilot. For example, the vibrational energy generated by the rotors of the helicopter may be transmitted to the cyclic through the body. Excessive disturbances (e.g., winds) or continuously changing inertia effects during the operation (e.g., gravity, acceleration) may cause a wrongful input to the force gradient. These unwanted and unintended inputs are filtered by simply setting an appropriate break-out force. In one embodiment, the force gradient 400 may be coupled with various types of sensors such as gyroscopes or accelerometers to further facilitate the distinction of intended inputs by the pilot from unwanted and unintended inputs.

According to one embodiment, sensor 410 may be nominally open or closed depending on the sensor selected. The range of detection varies depending on the material selection of end plate 430, the sensor type, environmental or operating conditions. A proper design for the proximity sensor is carefully chosen by taking into account these design factors.

It is understood that various shapes, designs and materials of end plate 430 can be used without departing from the scope of the present embodiment. For example, if sensor 410 is positioned at a different location on cylinder 402, end plate 430 is relocated on shaft 405 to be properly aligned with sensor 410. Typically, the material selection is closely linked to the sensor type. For instance, if an inductive sensor is used, a material having proper inductance should be used. If a magnetic sensor is used, a part of end plate 430 should be magnetized or a magnet should be mounted thereto.

According to one embodiment, a Hall-effect sensor is used to detect the directional dependency of the pilot's input. For example, when the pilot's input is applied, a current is induced in one direction by the movement of end plate 430 with respect to sensor 410. When the pilot release the cyclic, the current is induced in the opposite direction. By detecting the direction of the induced current, the state of the switch is transitioned (i.e., 'on'-to-'off' or 'off'-to-'on') as well as its static state (i.e., 'on' and 'off'). The switch's transitional state can be used as a control input to the AFCS.

According to one embodiment, sensor 410 has a small form-factor so that it can be inserted through a mounting hole on cylinder 402 as shown in FIG. 4A. For example, the inductive sensor manufactured by Balluff of Florence, Ky. (model number, BES 516-3046-G-E4-L-PU-05) is of cylindrical shape having a diameter of 3 mm and a length of 27 mm.

Sensor 410 and end plate 430 eliminates the need for actuator-ball alignment when break-out force adjustments are made. The mounting hole of sensor 410 is made within a design tolerance so that sensor 410 aligns with end plate 430 without manual adjustment. Typically, the gap between sensor 410 and end plate 430 is properly set using a shim of a certain thickness. The gap may not need to be accurately adjusted depending on the type of sensor 410 and end plate 430 being used. Alternatively, the electrical sensitivity of sensor 410 may be adjusted or calibrated accordingly to create a proper signal to the AFCS to avoid further manual adjustment.

With the improved design of the force gradient 400, there is no mechanical contact between the actuator and the sensor, thus issues involving wear and tear, binding and dust do not arise. Maintenance becomes easier since it removes the need for lubrication between contacting and moving parts. The likelihood of misalignment caused by the mechanical contact is also greatly reduced or even completely removed.

No adjustment is required to move force gradient 400 to adjust the rage of operation by forming end plate 430 onto shaft 405. Due to the integration of end plate 430 onto shaft 405, the pilot's input is less affected by the radial free-play of the shaft 405 with respect to force gradient 400. As a result, the pilot experiences improved feel for the switch with less wobble and more accurate feedback.

According to one embodiment, shaft 205 may be replaced with a new shaft that includes end plate 430 and sensor 410. A hole may be drilled to place sensor 410 onto cylinder 402 so that end plate 430 is properly aligned with the sensor 410. According to another embodiment, end plate 430 is formed or mounted outside of cylinder 420, and sensor 410 is mounted externally to cylinder 402 using a bracket or an attachment mechanism (not shown). Irrespective of the design choice, once sensor 410 and end plate 430 (or something equivalent) are aligned, no further adjustment or maintenance is required.

Figure 5A:
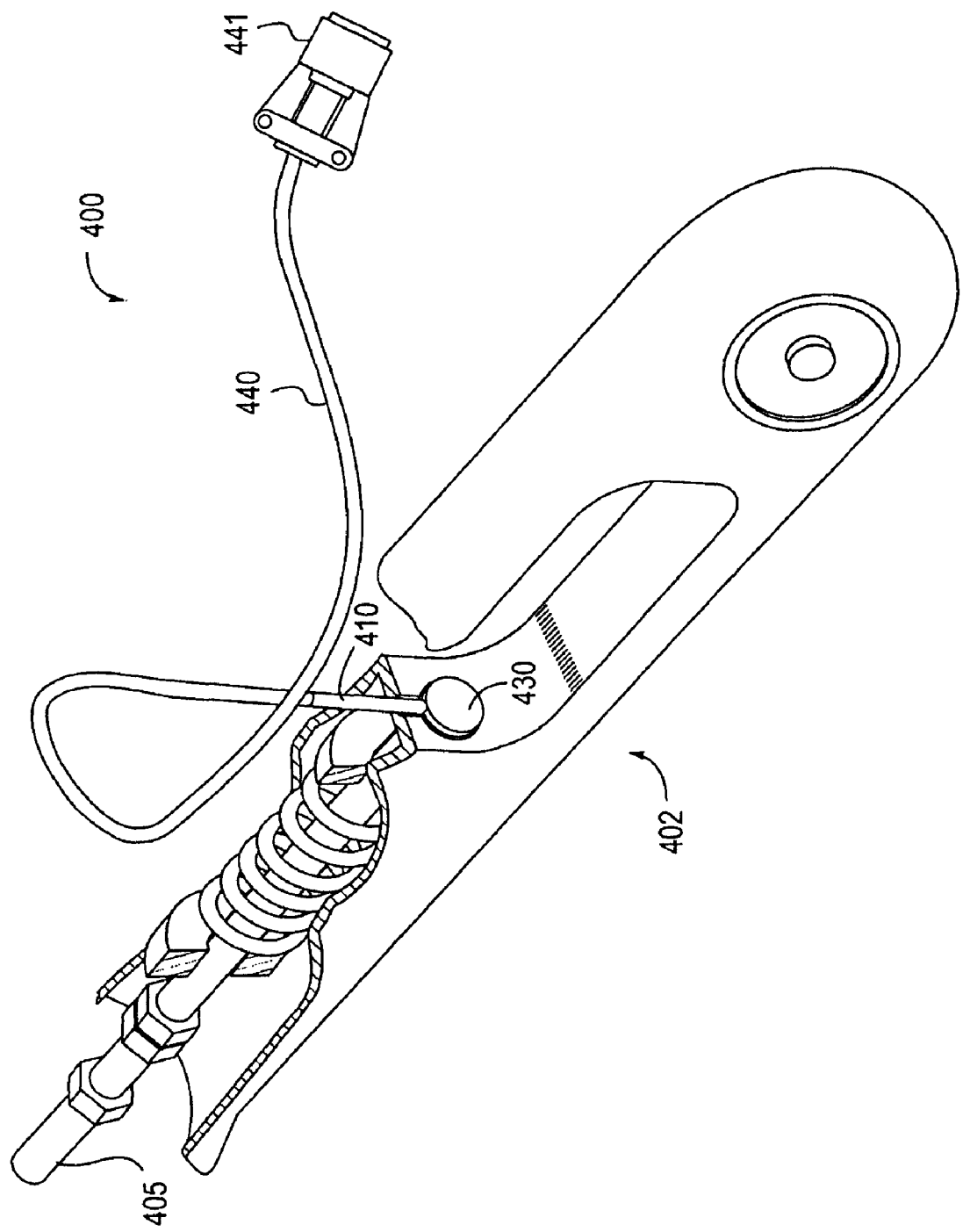
FIGS. 5A and 5B show alternative views of an exemplary force gradient using a non-contact proximity sensor, according to one embodiment.
Figure 5B:
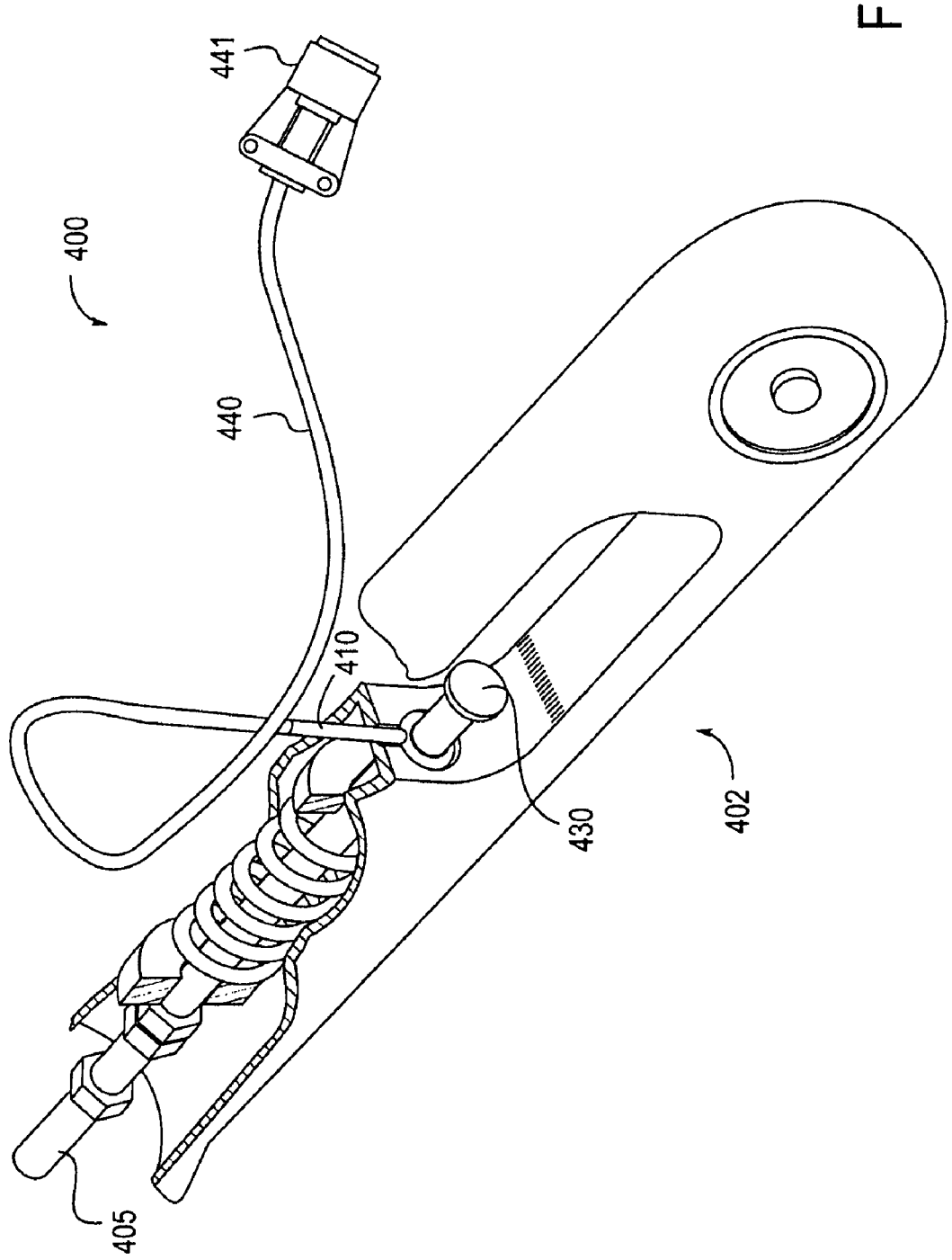

FIGS. 5A and 5B show perspective views of the exemplary force gradient 400, according to one embodiment. FIG. 5A illustrates a force gradient 400 with the AFCS engaged, according to one embodiment. Force gradient 400 includes cylinder 402, shaft 405, sensor 410, end plate 430, wire 440, and connector 441. End plate 430 is aligned with sensor 410.

FIG. 5B illustrates a force gradient 400 with the AFCS disengaged, according to one embodiment. Force gradient 400 includes cylinder 402, shaft 405, sensor 410, end plate 430, wire 440, and connector 441. End plate 430 is not aligned with sensor 410.

A force gradient using a non-contact proximity sensor has been described with respect to specific example and subsystems. It will be apparent to those of ordinary skill in the art that it is not limited to these specific examples or subsystems but extends to other embodiments as well.

I claim:

1. A force gradient comprising:
   a shaft having a first end and a second end, wherein the second end includes an end plate;
   a spring contained between the first end and the second end; and
   a non-contact proximity sensor mounted on the second end;
   wherein the spring has a first position and is compressed to a second position so that the non-contact proximity sensor detects the position of the end plate to signals an AFCS to change state, wherein the state includes one of, AFCS on-to-off and AFCS off-to-on.

2. The force gradient of claim 1, wherein the spring is compressed when the force gradient is moved by at least a break-out force.

3. The force gradient of claim 1, further comprising an end plate that is aligned with the non-contact proximity sensor in the first position.

4. The force gradient of claim 1, wherein the non-contact proximity sensor is one of a plurality of sensors, the plurality of sensors including an inductance sensor, a capacitive sensor, a magnetic sensor and a Hall-effect sensor.

5. The force gradient of claim 1, further comprising a wire interconnecting the non-contact proximity sensor and the AFCS.

6. The force gradient of claim 5, further comprising a connector to couple the wire and the AFCS.

7. The force gradient of claim 1, further comprising an outer cylinder surrounding the spring, the outer cylinder having a hole, and wherein the non-contact proximity sensor is placed in the hole.

8. The force gradient of claim 7, wherein the hole is near the second end of the shaft.

9. The force gradient of claim 7, wherein the force gradient is used with a helicopter.

10. A method, comprising:
    creating a hole in a cylinder of a force gradient;
    attaching an end plate to a shaft of the force gradient, the end plate aligning with the hole in the cylinder; and mounting a non-contact proximity sensor in the hole without contacting the end plate, wherein the non-contact proximity sensor detects a position of the end plate to signal an AFCS to change state, wherein the state includes one of, AFCS on-to-off or AFCS off-to-on.

11. The method of claim 10, further comprising generating a signal to change the state of an automatic flight control system when the force gradient experiences a break out force.

12. The method of claim 11, wherein generating the signal further comprises moving the end plate so that it is no longer aligned with the non-contact proximity sensor.

13. The method of claim 10, further comprising installing the force gradient in a helicopter.

14. The method of claim 10, further comprising installing the force gradient in an airplane.

* * * * *